United States Patent
Horiguchi et al.

(10) Patent No.: US 8,002,942 B2
(45) Date of Patent: Aug. 23, 2011

(54) METHOD FOR MANUFACTURING ELECTRONIC COMPONENT

(75) Inventors: Hiroki Horiguchi, Ritto (JP); Yuji Kimura, Otsu (JP); Kazuhiro Yoshida, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/702,553

(22) Filed: Feb. 9, 2010

(65) Prior Publication Data

US 2010/0132185 A1    Jun. 3, 2010

Related U.S. Application Data

(63) Continuation of application No. PCT/JP2008/061708, filed on Jun. 27, 2008.

(30) Foreign Application Priority Data

Aug. 10, 2007 (JP) ................................. 2007-208760

(51) Int. Cl.
  *B29C 65/02* (2006.01)
  *B32B 37/14* (2006.01)
(52) U.S. Cl. ............. 156/292; 156/293; 156/304.5; 156/308.4
(58) Field of Classification Search .......... None
  See application file for complete search history.

(56) References Cited

U.S. PATENT DOCUMENTS 6,540,855 B1 * 4/2003 Holmberg ................. 156/69

FOREIGN PATENT DOCUMENTS

| EP | 1 202 342 A2 | 5/2002 |
|----|----|----|
| EP | 1 804 296 A1 | 7/2007 |
| JP | 2002-118191 A | 4/2002 |
| JP | 2002-231920 A | 8/2002 |
| JP | 2007-189032 A | 7/2007 |
| WO | 2006/040986 A1 | 4/2006 |

OTHER PUBLICATIONS

Official Communication issued in International Patent Application No. PCT/JP2008/061708, mailed on Sep. 30, 2008.

* cited by examiner

*Primary Examiner* — John L. Goff
*Assistant Examiner* — Barbara J. Musser
(74) *Attorney, Agent, or Firm* — Keating & Bennett, LLP

(57) ABSTRACT

A triaxial acceleration sensor which has a structure including a cover joined to a substrate including a mechanically operable functional unit to be sealed, is adapted in such a way that the joined state can be reliably obtained so as to not interfere with a displacement of the functional unit. A sealing frame is made of a heated polyimide on a periphery of an upper main surface of a substrate provided with a functional unit, and a sealing layer made of a polyimide is formed over an entire lower main surface of a cover. For integrating the substrate and the cover so as to seal the functional unit, the sealing frame and the sealing layer are joined to each other by heating and pressurizing the sealing frame and the sealing layer at a temperature that is about 50° C. to about 150° C. higher than a glass transition temperature of the polyimide while bringing the sealing frame and the sealing layer into contact with each other. In this case, a recess is formed in the vicinity of a portion of the sealing layer to be brought into contact with the sealing frame so that a bump, generated from the sealing layer which is deformed in the joining step, is prevented from protruding toward the functional unit.

9 Claims, 7 Drawing Sheets

FIG. 2 (1)
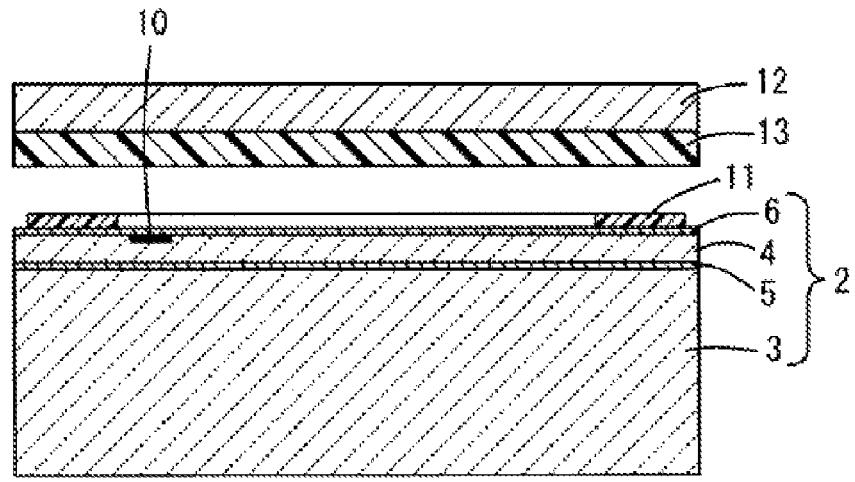
FIG. 2 (2)
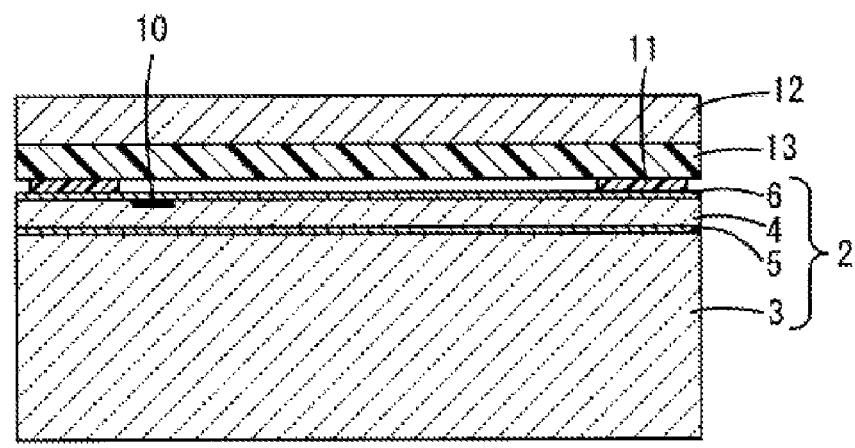
FIG. 2 (3)
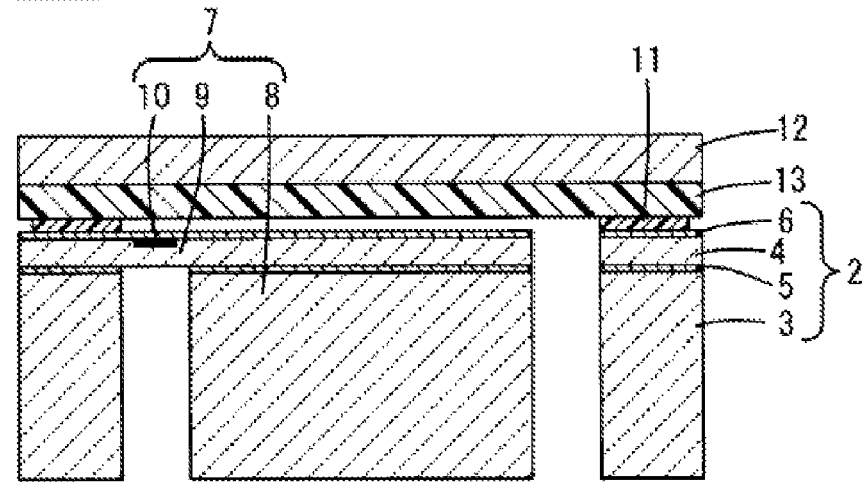

METHOD FOR MANUFACTURING ELECTRONIC COMPONENT

BACKGROUND OF THE INVENTION

1. Field of the Invention

The present invention relates to a method for manufacturing an electronic component, and more particularly, relates to a method for manufacturing an electronic component, such as a triaxial acceleration sensor, which includes a mechanically operable functional unit and requires a space that allows displacement or vibration of the functional unit and also requires an airtight seal.

2. Description of the Related Art

A technique of interest to the present invention is described in, for example, Japanese Unexamined Patent Publication No. 2002-231920, which discloses a solid-state image sensing device provided on a solid-state image sensor chip, with an airtight sealing unit formed of a flat plate of a transparent member and a frame unit formed on the undersurface of the flat plate. In the solid-state image sensing device, the frame unit is made of a chip-side polyimide film formed by printing in a region of the solid-state image sensor chip except at least a light receiving unit and a flat plate-side polyimide film formed by printing in a region of the flat plate corresponding to the chip-side polyimide film, and the chip side polyimide film and the flat plate side polyimide film are joined to each other with an adhesive interposed therebetween.

However, when an adhesive is used to join the two polyimide films in accordance with the method described in Japanese Unexamined Patent Publication No. 2002-231920, it is difficult to repeatedly apply the same predetermined amount of adhesive so as to provide a uniform thickness, thereby leading to a problem in that the thickness of the frame unit after the joining process, that is, a gap between the solid-state image sensor chip and the flat plate unit, is varied due to variations in the thickness of the applied adhesive and variations in loading in the case of joining by heating after the application. It is to be noted that this problem is not particularly elicited in the solid-state image sensing device disclosed in Japanese Unexamined Patent Publication No. 2002-231920.

On the other hand, electronic components such as, for example, triaxial acceleration sensors or surface acoustic wave filters as MEMS (Micro Electro Mechanical Systems) components include a mechanically operable functional unit, and require the securing of a space which allows displacement or vibration of the functional unit and require airtight sealing. When the method using an adhesive as described in Japanese Unexamined Patent Publication No. 2002-231920 is applied to a method for manufacturing an electronic component such as a triaxial acceleration sensor, the problem which is not elicited in the solid-state image sensing device will be elicited below.

A triaxial acceleration sensor which has a typical structure includes a substrate with a sealing frame formed on a periphery of one main surface and with a mechanically operable functional unit arranged in a region surrounded by the sealing frame, and a cover with a sealing layer formed over the entire surface of the one main surface, the sealing layer to be joined to the sealing frame, and the substrate and the cover are integrated by joining the sealing frame and the sealing layer to each other. Then, this integration of the substrate and cover results in securing of the space between the substrate and the cover which allows displacement or vibration of the functional unit, and also results in an airtight seal.

In the case of the triaxial acceleration sensor, the functional unit includes a spindle unit, a beam unit for supporting the spindle unit in a displaceable manner with respect to the substrate, and a piezoresistive unit for detecting a stress caused in the beam unit.

In such a triaxial acceleration sensor, the gap between the substrate and the cover restricts the displacement magnitude of the spindle. Thus, when the gap between the substrate and the cover is varied due to variations in the thickness of the applied adhesive and variations in loading in the case of joining by heating as described above, the variations in acceleration detection performance and durability will be caused. Furthermore, when an insufficient amount of adhesive is applied, the joining strength will be decreased. On the other hand, when an excess amount of adhesive is applied, the extra adhesive will flow out between the sealing frame and the sealing layer to adhere to the functional unit, thereby leading to a problem that the acceleration detection performance is degraded or varied.

SUMMARY OF THE INVENTION

Preferred embodiments of the present invention provide a method for manufacturing an electronic component, which solve the problems described above.

A method for manufacturing an electronic component according to a preferred embodiment of the present invention including a substrate with a sealing frame made of a cured resin, the sealing frame located on a periphery of one main surface and including a mechanically operable functional unit arranged in a region surrounded by the sealing frame, and a cover including a sealing layer made of the cured resin defining the sealing frame on the one main surface, the sealing layer to be joined to the sealing frame.

In order to solve the technical problems described above, in the method for manufacturing an electronic component according to a preferred embodiment of the present invention, the step of joining the sealing frame and the sealing layer to each other by heating and pressurizing the sealing frame and the sealing layer while bringing the sealing frame and the sealing layer into contact with each other, is carried out without the use of any adhesive, thereby integrating the substrate and the cover so as to seal the functional unit.

Furthermore, the method for manufacturing an electronic component according to a preferred embodiment of the present invention, includes a feature that a recess is formed in a portion of the sealing layer to be brought into contact with the sealing frame and/or a vicinity of the portion in the step of preparing the cover, or a recess is formed in a portion of the sealing frame to be brought into contact with the sealing layer in the step of preparing the substrate.

In the case of a first preferred embodiment where a recess is formed in the sealing layer, it is preferable that the recess be formed in a shape of a groove extending along an internal peripheral edge of a portion of the sealing layer to be brought into contact with the sealing frame. When the sealing frame has a quadrangular planar shape, for example, it is preferable that the recess be adapted to provide a larger volume in a portion corresponding to a corner portion of the sealing frame, as compared with the other portion.

In the first preferred embodiment, when the sealing frame has a quadrangular planar shape, for example, the recess may be formed to be distributed in the portion corresponding to the corner portion of the sealing frame.

In the case of a second preferred embodiment where a recess is formed in the sealing frame, it is preferable that the recess be formed in a shape of a groove extending along an internal peripheral edge of the sealing frame. When the sealing frame has a quadrangular planar shape, for example, it is preferable that the recess be adapted to provide a larger volume in a corner portion of the sealing frame, as compared with the other portion.

In the second preferred embodiment, when the sealing frame has a quadrangular planar shape, the recess may be formed to be distributed in the corner portion of the sealing frame.

Preferred embodiments of the present invention produce a striking effect when a dimension in a thickness direction of the sealing layer is greater than a dimension in a thickness direction of the sealing frame.

When the resin used in a preferred embodiment of the present invention is a thermoplastic resin, for example, it is preferable that the heating in the step of joining mentioned above be carried out at a temperature which is higher than a glass transition temperature of the resin and lower than a decomposition temperature of the resin.

On the other hand, when the resin used in a preferred embodiment of the present invention is a thermoplastic resin, for example, it is preferable that the heating in the step of joining mentioned above be carried out at a temperature which is higher than a glass transition temperature of the resin and lower than a melting point of the resin.

Furthermore, in a preferred embodiment of the present invention, it is preferable that the resin be a polyimide, for example.

It is to be noted that, as described above, both thermosetting resin and thermoplastic resin can be used as the resin for constituting the sealing frame and the sealing layer, for example. When a thermosetting resin is used, "curing" refers to a state where a soluble and fusible substance having a relatively low molecular weight initiates a chemical reaction by heat or a catalyst to become a spatial network polymer (a sterically complex network state linked by covalent bonds). Therefore, the cured state can be maintained without melting even when heating is carried out. On the other hand, when a thermoplastic resin is used, "curing" refers to a state where molecules are intertwined into a chain (chain polymer) without the covalent bonds as in thermosetting resins. When heated to the melting point or more, the chain is loosened to melt, and plastic deformation is caused to go into a flowing state, whereas when cooled below the melting point, the chain is reversibly brought into a cured state.

Preferred embodiments of the present invention are particularly advantageously applied when the functional unit includes a spindle unit, a beam unit arranged to support the spindle unit in a displaceable manner with respect to the substrate, and a piezoresistive unit arranged to detect a stress caused in the beam unit, and when the electronic component constitutes a triaxial acceleration sensor.

According to a preferred embodiment of the present invention, first, since no adhesive is used to join a sealing frame and a sealing layer, the problem of variations in a thickness of an applied adhesive can be completely avoided. Furthermore, the sealing frame made of a resin and the sealing layer also made of a resin are joined to each other by heating and pressurizing the sealing frame and the sealing layer while bringing the sealing frame and the sealing layer into contact with each other, without an adhesive interposed therebetween. Thus, variations in a gap between the joined substrate and cover are minimized. This is because the variations in deformation of the resin due to the heating and pressurization is smaller as compared with variations in the thickness of an applied adhesive in the case of using the adhesive and with variations in the thickness of an adhesive layer caused by variations in loading in the case of joining by heating using an adhesive.

Therefore, variations in spatial dimension can be reduced, which restricts displacement magnitude or vibration amplitude of a mechanically operable functional unit. As a result, when a preferred embodiment of the present invention is applied to a triaxial acceleration sensor, variations in acceleration detection performance and durability can be minimized.

Furthermore, according to a preferred embodiment of the present invention, a recess is preferably formed in the sealing layer or the sealing frame. Therefore, when the resin constituting the sealing frame and/or sealing layer is deformed to generate a bump as a result of the heating and pressurization in the step of joining the sealing frame and the sealing layer to each other, the bump can be advantageously absorbed by the recess. Therefore, the bump of the resin can be prevented from coming into contact with the functional unit or coming extremely close to the functional unit.

In particular, when a preferred embodiment of the present invention is applied to a triaxial acceleration sensor, the bump of the resin can be prevented from coming into contact with the functional unit to degrade the acceleration detection performance or cause variations in the acceleration detection performance.

Furthermore, according to a preferred embodiment of the present invention, assuming that the bump of the resin will be generated, it is not necessary to provide a design for widening the gap between the substrate and the cover in order to prevent the bump from coming into contact with the functional unit, even when the bump of the resin is generated. Thus, the electronic component can be reduced in size.

When the sealing frame has a quadrangular planar shape, for example, the resin tends to more extensively protrude in a corner portion of this quadrangle. Therefore, the bump can be effectively absorbed when the recess is formed so as to provide a larger volume in the corner portion.

When the dimension in the thickness direction of the sealing layer is made greater than the dimension in the thickness direction of the sealing frame, a cushioning effect produced by the sealing layer can be improved. Therefore, even when the functional unit collides with the sealing layer, the functional unit can be prevented from being broken.

When the resin used in a preferred embodiment of the present invention is a thermosetting resin, increasing the heating temperature in the joining step above a glass transition temperature of the resin can decrease a degree of elasticity of the resin. Thus, irregularities of the sealing frame, substrate, and cover are absorbed. Therefore, since the sealing frame is easily joined over the entire surface, a rate of non-defective products can be improved in terms of sealing. On the other hand, when the heating temperature is decreased below a decomposition temperature of the resin, the amount of the resin can be thus prevented from being decreased due to thermal decomposition, and the joining can be achieved while keeping the amount of the resin sufficient for sealing, and the rate of non-defective products can be likewise improved in terms of sealing.

Also, when the resin used in a preferred embodiment of the present invention is a thermoplastic resin, increasing the heating temperature in the joining step above the glass transition temperature of the resin can decrease the degree of elasticity of the resin. Thus, the irregularities of the sealing frame, substrate, and cover are absorbed. Therefore, since the sealing frame is easily joined over the entire surface, the rate of non-defective products can be improved in terms of sealing.

On the other hand, when the heating temperature is set below the melting point of the resin, the resin can be prevented from flowing into the functional unit and the like of the electronic component in the case where the temperature becomes equal to the melting point or higher.

Polyimides include thermosetting polyimides and thermoplastic polyimides. In various preferred embodiments of the present invention, either type of polyimide can be used to form sealing frames with excellent adhesion properties and sealing properties, and necessary processing in the subsequent step can be carried out with a high degree of accuracy since the sealing frame has a sufficient strength after the sealing process.

Other elements, features, steps, characteristics and advantages of the present invention will become more apparent from the following detailed description of the preferred embodiments with reference to the attached drawings.

BRIEF DESCRIPTION OF THE DRAWINGS

FIGS. 2(1) to 2(3) are cross-sectional views sequentially illustrating typical steps included in a method for manufacturing the triaxial acceleration sensor 1 shown in FIG. 1.

DETAILED DESCRIPTION OF THE PREFERRED EMBODIMENTS

Figure 1:
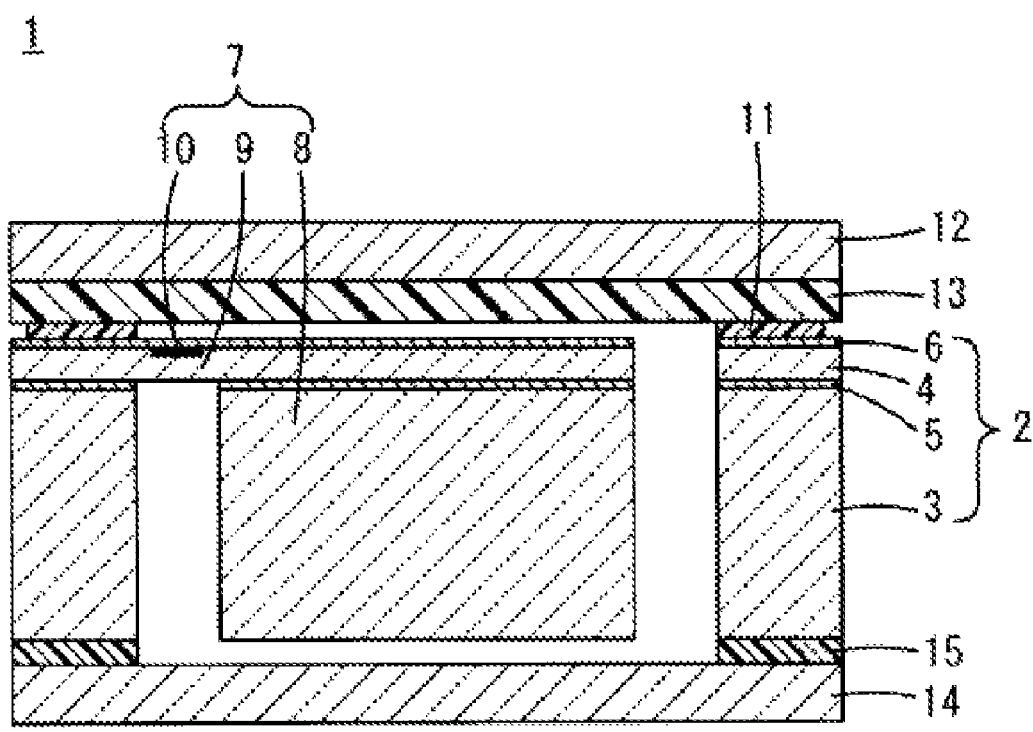
FIG. 1 is a cross-sectional view illustrating a triaxial acceleration sensor 1 as an example of an electronic component to which a preferred embodiment of the present invention is applied.

FIG. 1 is a cross-sectional view illustrating a triaxial acceleration sensor 1 as an example of an electronic component to which a preferred embodiment of the present invention is applied. It is to be noted that no characteristic configuration of the present invention is shown in FIG. 1.

The triaxial acceleration sensor 1 includes a SOI (Silicon-On-Insulator) substrate 2. The SOI substrate 2 has a structure in which a silicon oxide film 5 is interposed between a silicon substrate 3 and a surface silicon layer 4, and in this preferred embodiment, the surface of the surface silicon layer 4 is covered with a protective film 6 made of $SiO_2$.

The SOI substrate 2 is provided with a mechanically operable functional unit 7. The functional unit 7 includes a spindle unit 8, a beam unit 9 arranged to support the spindle unit 8 in a displaceable manner with respect to the SOI substrate 2, and a piezoresistive unit 10 arranged to detect a stress caused in the beam unit 9. The SOI substrate 2 includes a sealing frame 11 formed on the periphery of the upper main surface. The sealing frame 11 is arranged so as to surround the functional unit 7 described above, and preferably has a quadrangular planar shape, for example. The sealing frame 11 is made of a thermally cured thermosetting resin, for example, polyimide.

The upper main surface of the SOI substrate 2 is provided with a top cover 12 made of glass. The lower main surface of the top cover 12 has a sealing layer 13 formed over the entire surface. The sealing layer 13 is made of the same thermally cured thermosetting resin as the thermosetting resin constituting the sealing frame 11, for example, polyimide. The sealing layer 13 and the sealing frame 11 are joined to each other.

The sealing frame 11 eventually has the function of airtightly sealing and protecting the functional unit 7, as well as the function of securing, with its thickness, a space for the displacement of the functional unit 7, in particular, the displacement range of the spindle unit 8. Therefore, while the functional unit 7, in particular, the spindle unit 8 may collide with the sealing layer 13, the sealing layer 13 also serves as a cushioning material to prevent the functional unit 7 from being broken even in the case of such a collision. In order to improve this cushioning performance, it is preferable that the dimension in the thickness direction of the sealing layer 13 be greater than the dimension in the thickness direction of the sealing frame 11. As an example, when the dimension in the thickness direction of the sealing frame 11 is about 5 μm, the dimension in the thickness direction of the sealing layer 13 preferably is about 15 μm.

The lower main surface of the SOI substrate is provided with a bottom cover 14 made of glass. The bottom cover 14 is joined through a junction 15 to the SOI substrate 2, thereby airtightly sealing the functional unit 7. The junction 15 is made of a thermosetting resin such as, for example, polyimide.

Next, a method for manufacturing a triaxial acceleration sensor 1 will be described with reference to FIGS. 2(1) to 2(3).

First, as shown in FIG. 2(1), a SOI substrate 2 is prepared. The SOI substrate 2 is provided with a piezoresistive unit 10 and a required conductor for wiring (not shown).

In order to form a sealing frame 11, an uncured thermosetting resin such as, for example, polyimide, is applied on the upper main surface of the SOI substrate 2 by, for example, spin coating, and then subjected to patterning into a frame shape by using a photolithography technique, and then subjected to a thermal curing treatment. When a polyimide is used as the thermosetting resin, the thermal curing treatment is carried out in a nitrogen atmosphere at a heating temperature of about 250° C. to about 450° C., for example, by using an atmosphere controllable furnace such as, for example, an inert gas oven. This results in a solvent component sufficiently flying apart from the polyimide, and proceeds with imidization, thereby sufficiently curing the polyimide.

On the other hand, also as shown in FIG. 2(1), a top cover 12 is prepared. The lower main surface of the top cover 12 has a sealing layer 13 formed over the entire surface. For an application method and a thermal curing treatment method for the formation of the sealing layer 13, substantially the same methods as in the case of the sealing frame 11 described above can be applied.

Next, as shown in FIG. 2(2), while bringing the sealing frame 11 and the sealing layer 13 into contact with each other, the sealing frame 11 and the sealing layer 13 are heated and pressurized to be joined to each other, thereby integrating the SOI substrate 2 and the top cover 12. For the heating in this joining step, a temperature is imparted which is higher than the glass transition temperature of the thermosetting resin constituting the sealing frame 11 and the sealing layer 13 but does not thermally decompose the thermosetting resin. When a polyimide is used as the thermosetting resin, it is preferable to carry out the heating at a temperature which is, for example, about 50° C. to about 150° C. higher than the glass transition temperature of the polyimide. It is to be noted that while the glass transition temperature of the polyimide varies depending on the type of the resin and the thermal curing temperature, a temperature of about 250° C. to about 400° C., for example, is typically imparted in the joining step.

As an example, when a polyimide with a grass transition temperature of about 230° C. was used, heating at a temperature of 300° C. and pressurization at a contact pressure of about 2.4 MPa held for approximately 15 minutes in the joining step allowed the sealing frame 11 and the sealing layer 13 to be joined adequately. In this case, it is also possible to reduce the holding time by increasing the contact pressure.

Next, as shown in FIG. 2(3), in order to form a spindle unit 8 and a beam unit 9 as a functional unit 7 in the SOI substrate 2, a photolithography technique is used to apply an etching treatment, from the lower main surface side of the SOI substrate 2.

Next, although not shown in FIGS. 2(1) to 2(3), a bottom cover 14 is joined through a junction 15 to the lower main surface of the SOI substrate 2. For joining the bottom cover 14, the same step as in the case of joining the top cover 12 as described above may be used.

Figure 3:
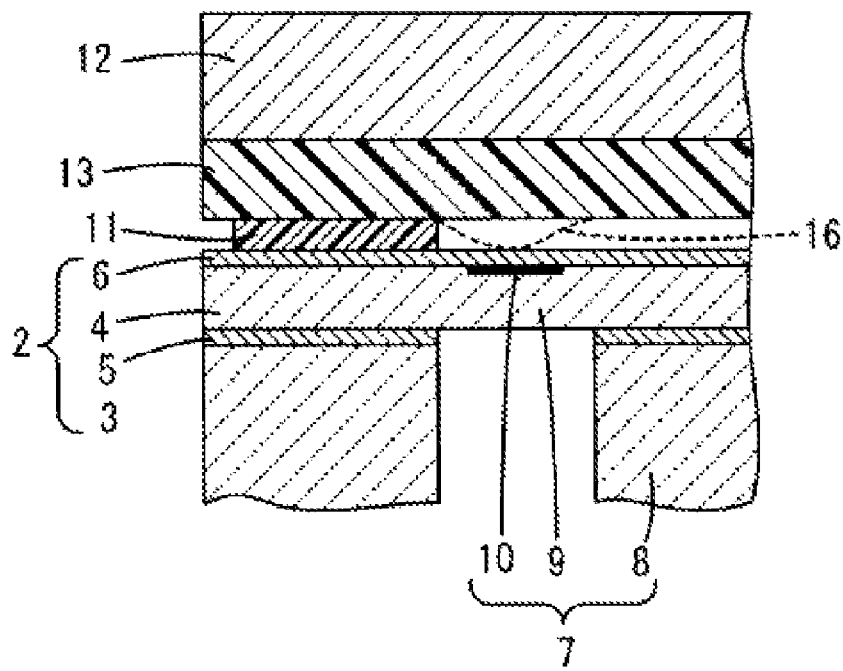
FIG. 3 is a diagram illustrating an enlarged portion of the triaxial acceleration sensor 1 shown in FIG. 1, for describing the problem to be solved by a preferred embodiment of the present invention.

FIG. 3 is a diagram for describing a problem to be solved by various preferred embodiments of the present invention, in which the enlarged junction between the sealing frame 11 and the sealing layer 13 in the triaxial acceleration sensor 1 shown in FIG. 1 is shown.

Referring to FIG. 3, as described above, when the sealing frame 11 and the sealing layer 13 are joined to each other by pressurization with heating, as a result of the pressurization, a resin bump 16 as indicated by a dashed line in FIG. 3 may be generated near a portion of the sealing frame 11 and the sealing layer 13 in contact with each other. In this preferred embodiment, the dimension in the thickness direction of the sealing layer 13 is greater than the dimension in the thickness direction of the sealing frame 11. Therefore, the resin is likely to be deformed in the sealing layer 13, and as a result, the bump 16 is likely to be generated in the sealing layer.

This bump 16 may undesirably come into contact with the functional unit 7, for example, the beam unit 9, or reach the vicinity of the beam unit 9 without coming into contact with the beam unit 9. In any case, the bump 16 interferes with mechanical movements of the functional unit 7, thereby leading to degradation of the acceleration detection performance and variations in acceleration detection accuracy.

Figure 4:
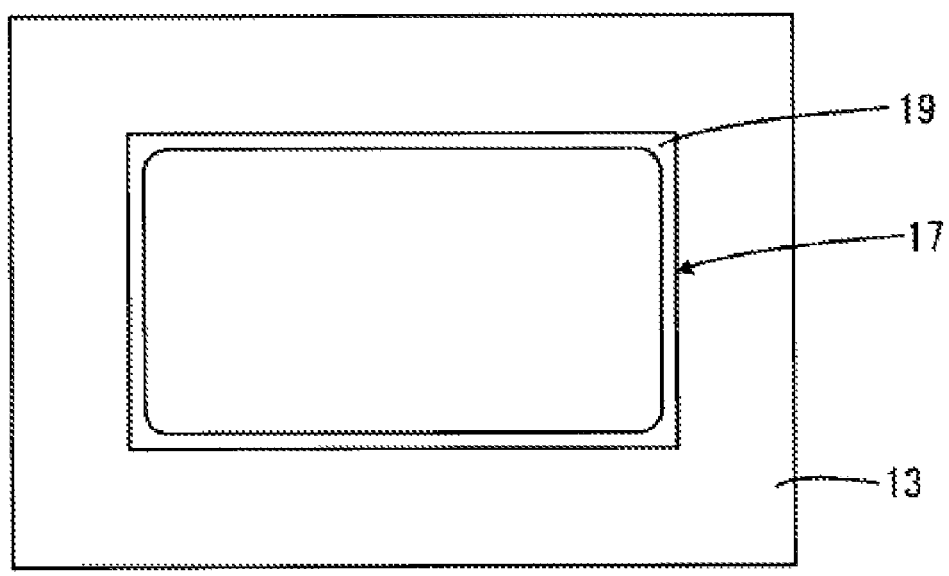
FIG. 4 is a diagram for describing a first preferred embodiment of the present invention, which illustrates a lower surface of a top cover 12 in the step of FIG. 2(1).
Figure 5:
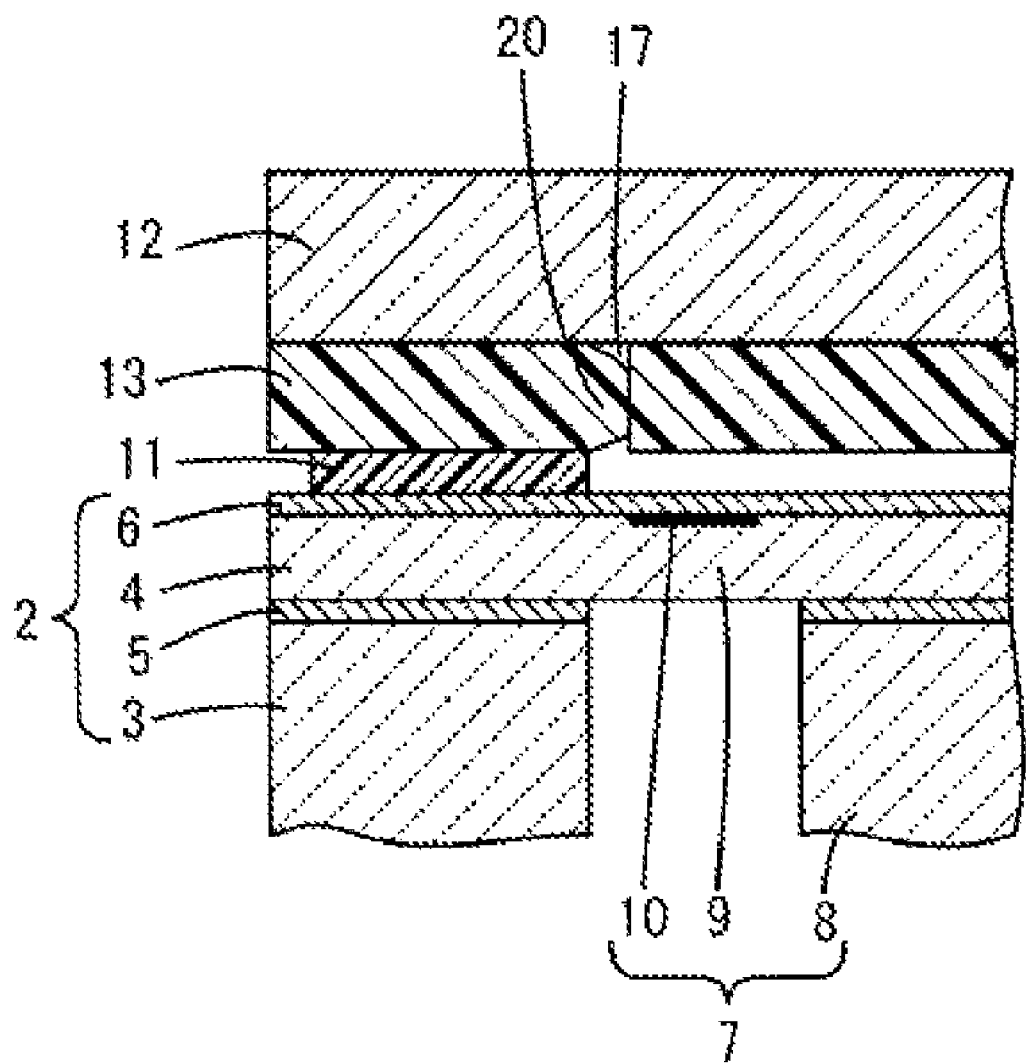
FIG. 5 is a diagram illustrating an enlarged portion of a triaxial acceleration sensor 1 obtained in accordance with the preferred embodiment shown in FIG. 4, which corresponds to FIG. 3.
Figure 6:
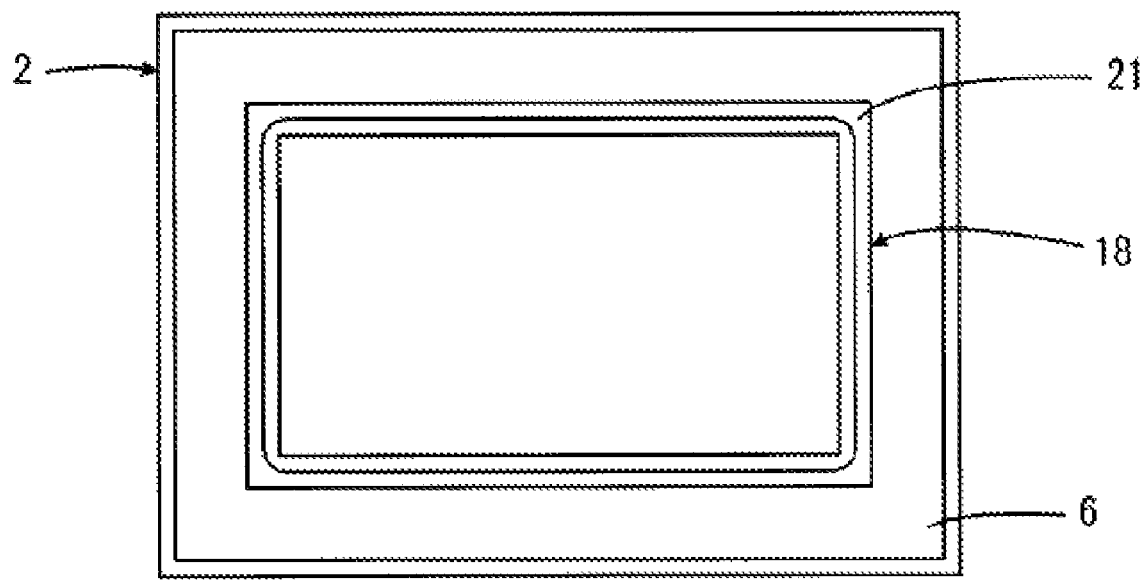
FIG. 6 is a diagram for describing a second preferred embodiment of the present invention, which illustrates an upper surface of an SOI substrate 2 in the step of FIG. 2(1).
Figure 7:
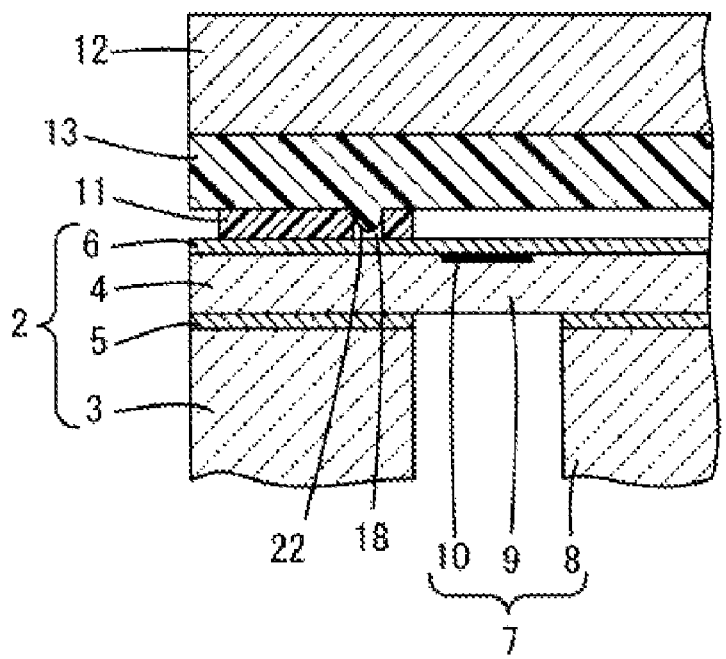
FIG. 7 is a diagram illustrating an enlarged portion of a triaxial acceleration sensor 1 obtained in accordance with the preferred embodiment shown in FIG. 6, which corresponds to FIG. 3 or 5.

In order to prevent these problems from being caused, a recess 17 is formed in a portion of the sealing layer 13 to be brought into contact with the sealing frame 11 and/or the vicinity thereof in the step of preparing the top cover 12 as shown in FIGS. 4 and 5 in a first preferred embodiment of the present invention, whereas a recess 18 is formed in a portion of a surface of the sealing frame 11 to be brought into contact with the sealing layer 13 in the step of preparing the SOI substrate 2 as shown in FIGS. 6 and 7 in a second preferred embodiment of the present invention. Details of the first and second preferred embodiments will be described below.

FIGS. 4 and 5 are diagrams for describing the first preferred embodiment, where FIG. 4 is a diagram illustrating the lower surface of the top cover 12 in the step of FIG. 2(1), whereas FIG. 5 is a diagram corresponding to FIG. 3.

In the first preferred embodiment, the recess 17 is preferably formed in a shape of a groove extending along an internal peripheral edge of the portion of the sealing layer 13 to be brought into contact with the sealing frame 11. While the sealing frame 11 preferably has a quadrangular planar shape as described above, it is preferable that the recess 17 be chamfered in a portion 19 corresponding to a corner portion of the sealing frame 11, thereby providing a larger volume as compared with the other portion.

The recess 17 as described above may be formed by forming the sealing layer 13 with a uniform thickness and then applying a patterning process to the sealing layer 13 with the use of a photolithography technique before a thermal curing treatment, or may be formed by a sand blasting treatment or an etching treatment after a heating treatment.

The recess 17 may be arranged to pass through the sealing layer 13 in the thickness direction, as shown in the figure, or may be provided partially in the thickness direction. Furthermore, the recess 17 may be formed in a shape of a continuously extending groove as shown in FIG. 4, or may be formed to be distributed intermittently.

When the step of joining the sealing frame 11 and the sealing layer 13 is completed, a bump 20 which may be generated in the sealing layer 13 is advantageously absorbed by the recess 17 to suppress protrusion toward the functional unit 7. Since this bump 20 is generated more frequently in the corner portion of the quadrangular sealing frame 11, it is meaningful to increase the volume of the portion 19 corresponding to the corner portion in the recess 17 as described above.

As described above, when the sealing frame 11 and the sealing layer 13 are made of a polyimide with a glass transition temperature of about 230° C., when conditions including a heating temperature of about 300° C., a contact pressure of about 2.4 MPa, and holding time of approximately 15 minutes are used in the joining step, and further when the sealing layer 13 has a thickness of about 15 μm whereas the sealing frame 11 has a width of about 300 μm and a thickness of about 5 μm, for example, it is confirmed that the bump 20 can be adequately absorbed in the recess 17 by providing the recess 17 to have a cross-sectional area of about 75 μm$^2$ or more.

FIGS. 6 and 7 are diagrams for describing the second preferred embodiment, where FIG. 6 is a diagram illustrating the upper surface of the SOI substrate 2 in the step of FIG. 2(1), and FIG. 7 is a diagram corresponding to FIG. 3 or 5.

In the second preferred embodiment, the recess 18 is preferably formed in a shape of a groove extending along the vicinity of an internal peripheral edge of the sealing frame 11. While the sealing frame 11 preferably has a quadrangular planar shape as described above, the recess 18 is preferably chamfered in a corner portion 21 of the sealing frame 11 so as to provide a larger volume as compared with the other portion.

The recess 18 may be arranged to pass through the sealing frame 11 in the thickness direction, or may be provided partially in the thickness direction. Furthermore, the recess 18 may be formed to extend intermittently, rather than being formed in a shape of a continuously extending groove as shown in the figure.

For forming the recess 18 in the sealing frame 11, for example, it is preferable to form the recess 18 at the same time in the patterning step with the use of a photolithography technique for forming the sealing frame 11. However, the recess 18 may be formed by applying a sand blast treatment or an etching treatment after a thermal curing treatment, for example.

When the sealing frame 11 and the sealing layer 13 are joined to each other, a bump 22 from the sealing layer 13 can be advantageously absorbed by the recess 18 provided in the sealing frame 11, as shown in FIG. 7. Therefore, the generation of the recess 16 as shown in FIG. 3 can be prevented.

As an example, in the case of joining the sealing frame 11 and the sealing layer 13 while heating and pressurizing under the conditions mentioned above, when the sealing layer 13 has a thickness of about 15 μm, for example, whereas the sealing frame has a width of about 240 μm, for example, for the portion outside the recess 18 and a width of about 30 μm, for example, for the portion inside the recess 18 and a thickness of about 5 μm, for example, and the recess 18 to have a cross-sectional area of about 75 μm$^2$ or more, for example, it is confirmed that bumps in contact with the functional unit 7 can be prevented from generating like the bump 16 shown in FIG. 3 by absorbing the bump 22 from the sealing layer 13 into the recess 18.

Figure 8:
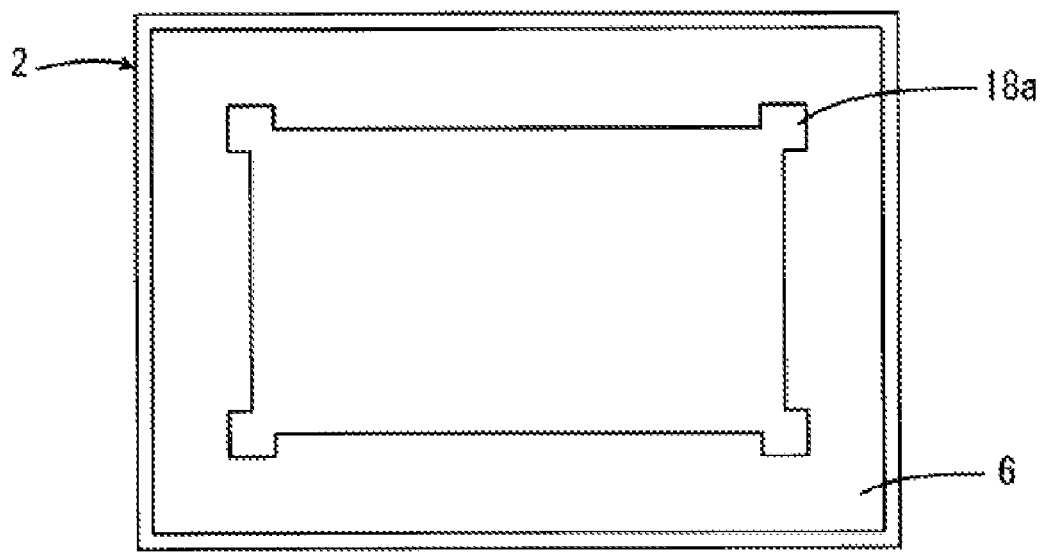
FIG. 8 is a diagram illustrating a modification example of the second preferred embodiment according to the present invention, which corresponds to FIG. 6.

FIG. 8 is a diagram corresponding to FIG. 6, which shows a modification example of the second preferred embodiment. In FIG. 8, components corresponding to the components shown in FIG. 6 are denoted by the same reference symbols, and descriptions thereof will not be repeated.

The preferred embodiment shown in FIG. 8 has a feature that a recess 18a is formed to be distributed in a corner portion of the sealing frame 11, rather than being formed to extend in a shape of a groove. While the recess 18a is shown as a rectangular recess, the recess 18a may have other shapes such as a circle. This preferred embodiment is effective when the bump 16 as shown in FIG. 3 is generated mainly in the corner portion of the sealing frame 11.

Figure 9:
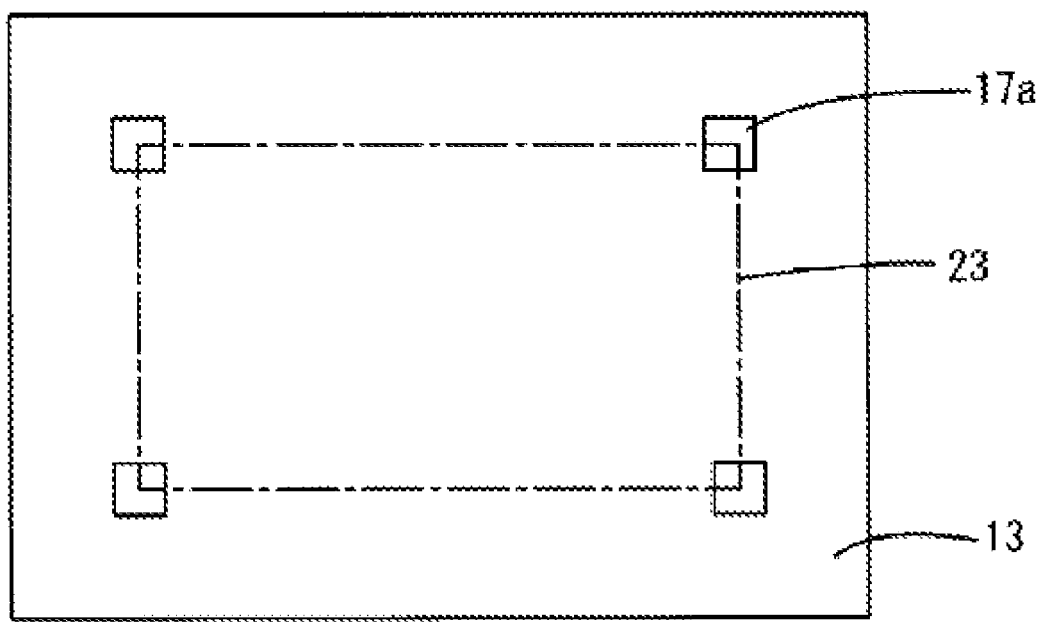
FIG. 9 is a diagram illustrating a modification example of the first preferred embodiment according to the present invention, which corresponds to FIG. 4.

FIG. 9 is a diagram corresponding to FIG. 4, which shows a modification example of the first preferred embodiment described above. In FIG. 9, components corresponding to the components shown in FIG. 4 are denoted by the same reference symbols, and descriptions thereof will not be repeated.

In FIG. 9, a position of an internal peripheral edge 23 of a quadrangular sealing frame 11 is indicated by an alternate long and short dash line.

The preferred embodiment shown in FIG. 9 includes a feature that a recess 17a is formed to be distributed in a portion corresponding to the corner portion of the sealing frame 11. While the recess 17a is shown as a rectangular recess, the recess 17a may have other shapes such as a circle.

The preferred embodiment shown in FIG. 9 is advantageously applied under the same conditions as in the preferred embodiment shown in FIG. 8 described above.

While the present invention has been described in connection with the preferred embodiments shown in the figures, a variety of modification examples are possible within the scope of the present invention.

For example, the recess for allowing bumps of the thermosetting resin to escape may be formed in both the sealing frame 11 and the sealing layer 13.

Furthermore, while the case of manufacturing a single triaxial acceleration sensor 1 has been described for the manufacturing method described above, the manufacturing method described above may be carried out for an SOI parent substrate (wafer) from which multiple triaxial acceleration sensors 1 can be taken, in such a way that the substrate may be finally divided to take out the individual triaxial acceleration sensors 1.

Furthermore, while a polyimide is cited as an example of the thermosetting resin in the description above, the present invention can be applied in the case of other thermosetting resins such as a BCB resin and an epoxy resin.

Furthermore, instead of the thermosetting resin, curable resins which are cured by other methods, such as, for example, photo-curable resins which are cured by applying ultraviolet light having a predetermined wavelength, may be used in preferred embodiments of the present invention.

Furthermore, thermoplastic resins can be used in addition to curable resins such as the thermosetting reins or photo-curable resins described above. In particular, in the case of using a thermoplastic resin, the same sealing properties can be obtained as in the case of using the thermosetting resin when the heating temperature in the joining step is imparted to be higher than the glass transition temperature of the resin and lower than the melting point.

Moreover, the electronic component to which one of the preferred embodiments of the present invention is applied may be any electronic component as long as the electronic component includes a mechanically operable functional unit, and may be surface acoustic wave filters, other high-frequency circuit components, or the like, besides triaxial acceleration sensors. Therefore, the SOI substrate 2, the top cover 12, and the bottom cover 14 can also be modified depending on the function of the electronic component.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing an electronic component, comprising the steps of:

preparing a substrate including a sealing frame made of a cured resin, the sealing frame being formed on a periphery of one main surface of the substrate and a functional unit is arranged in a region surrounded by the sealing frame;

preparing a cover including a sealing sheet bonded onto a surface of the cover and formed from a same cured resin as the cured resin formed on the one main surface of the substrate, the sealing sheet being arranged to be joined to the sealing frame; and joining the sealing frame and the sealing sheet to each other by heating and pressurizing the sealing frame and the sealing sheet while bringing the sealing frame and the sealing sheet into contact with each other to integrate the substrate and the cover so as to seal the functional unit; wherein the step of preparing the substrate includes a step of forming a recess in a portion of the sealing frame to be brought into contact with the sealing sheet.

2. The method for manufacturing an electronic component according to claim 1, wherein the recess is formed in a shape of a groove extending along an internal peripheral edge of the sealing frame.

3. The method for manufacturing an electronic component according to claim 2, wherein the sealing frame has a quadrangular planar shape, and the recess is adapted to provide a larger volume in a corner portion of the sealing frame, as compared with another portion of the sealing frame.

4. The method for manufacturing an electronic component according to claim 1, wherein the sealing frame has a quadrangular planar shape, and the recess is formed to be distributed in a corner portion of the sealing frame.

5. The method for manufacturing an electronic component according to claim 1, wherein a dimension in a thickness direction of the sealing sheet is greater than a dimension in a thickness direction of the sealing frame.

6. The method for manufacturing an electronic component according to claim 1, wherein the resin is a thermosetting resin, and the heating in the step of joining is carried out at a temperature which is higher than a glass transition temperature of the resin and lower than a decomposition temperature of the resin.

7. The method for manufacturing an electronic component according to claim 1, wherein the resin is a thermoplastic resin, and the heating in the step of joining is carried out at a temperature which is higher than a glass transition temperature of the resin and lower than a melting point of the resin.

8. The method for manufacturing an electronic component according to claim 1, wherein the resin is a polyimide.

9. The method for manufacturing an electronic component according to claim 1, wherein the functional unit comprises a spindle unit, a beam unit arranged to support the spindle unit in a displaceable manner with respect to the substrate, and a piezoresistive unit arranged to detect a stress caused in the beam unit, and the electronic component constitutes a triaxial acceleration sensor.

* * * * *